United States Patent
Datta et al.

(10) Patent No.: US 11,750,151 B2
(45) Date of Patent: Sep. 5, 2023

(54) APPARATUS AND METHODS FOR BIASING OF POWER AMPLIFIERS

(71) Applicant: Skyworks Solutions, Inc., Irvine, CA (US)

(72) Inventors: Kunal Datta, San Jose, CA (US); Khaled A. Fayed, Marion, IA (US); Edward James Anthony, Robins, CA (US); Srivatsan Jayaraman, Santa Clara, CA (US); Jinghang Feng, Santa Clara, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/347,039

(22) Filed: Jun. 14, 2021

(65) Prior Publication Data

US 2022/0006426 A1    Jan. 6, 2022

Related U.S. Application Data

(63) Continuation of application No. 16/738,654, filed on Jan. 9, 2020, now Pat. No. 11,070,171.

(Continued)

(51) Int. Cl.
*H03F 1/02*     (2006.01)
*H03F 3/24*     (2006.01)
(Continued)

(52) U.S. Cl.
CPC ............ *H03F 1/0211* (2013.01); *H03F 1/56* (2013.01); *H03F 3/245* (2013.01); *H04B 1/40* (2013.01);
(Continued)

(58) Field of Classification Search
None
See application file for complete search history.

(56) References Cited

U.S. PATENT DOCUMENTS

| | | |
|---|---|---|
| 4,673,886 A | 6/1987 | Bickley et al. |
| 4,728,905 A | 3/1988 | Zhiwei |
| | (Continued) | |

FOREIGN PATENT DOCUMENTS

| | | |
|---|---|---|
| JP | H09-51238 | 2/1997 |
| JP | 2006-319737 | 11/2006 |
| | (Continued) | |

OTHER PUBLICATIONS

International Search Report and Written Opinion for application No. PCT/US2020/012788, dated May 7, 2020.

(Continued)

*Primary Examiner* — Tuan A Tran
(74) *Attorney, Agent, or Firm* — Knobbe, Martens, Olson & Bear, LLP

(57) ABSTRACT

Apparatus and methods for biasing power amplifiers are provided herein. In certain embodiments, a power amplifier includes a bipolar transistor having a base biased by a bias network having a reactance that controls an impedance at the transistor base to achieve substantially flat phase response over large dynamic power levels. For example, the bias network can have a frequency response, such as a high-pass or band-pass response, that reduces the impact of power level on phase distortion (AM/PM).

20 Claims, 14 Drawing Sheets

Related U.S. Application Data

(60) Provisional application No. 62/790,643, filed on Jan. 10, 2019.

(51) Int. Cl.
  *H03F 1/56* (2006.01)
  *H03F 3/04* (2006.01)
  *H01L 23/66* (2006.01)
  *H04B 1/40* (2015.01)
  *H04W 52/52* (2009.01)

(52) U.S. Cl.
  CPC ....... *H04W 52/52* (2013.01); *H03F 2200/102* (2013.01); *H03F 2200/222* (2013.01); *H03F 2200/318* (2013.01); *H03F 2200/387* (2013.01); *H03F 2200/451* (2013.01)

(56) References Cited

U.S. PATENT DOCUMENTS

| | | | |
|---|---|---|---|
| 6,084,472 A * | 7/2000 | Gilbert | H03G 7/06 330/254 |
| 6,333,677 B1 * | 12/2001 | Dening | H03F 1/302 330/285 |
| 6,750,719 B2 * | 6/2004 | Toyota | H03F 3/45085 330/296 |
| 6,819,179 B2 * | 11/2004 | Raja | H03F 3/72 330/285 |
| 7,199,652 B2 * | 4/2007 | Morimoto | H03F 3/19 327/560 |
| 7,288,987 B2 | 10/2007 | Carichner et al. | |
| 7,382,194 B2 | 6/2008 | Apel | |
| 7,411,457 B2 | 8/2008 | Ono et al. | |
| 7,443,236 B2 * | 10/2008 | Dow | H03F 1/56 330/129 |
| 7,714,664 B2 * | 5/2010 | Kanaya | H03F 1/0261 330/296 |
| 7,834,700 B2 * | 11/2010 | Inamori | H03F 3/245 330/124 R |
| 7,843,268 B2 * | 11/2010 | Benson | H03F 1/223 330/286 |
| 8,260,224 B2 * | 9/2012 | Doherty | H03G 3/3047 455/127.1 |
| 8,618,884 B2 * | 12/2013 | Yagasaki | H03F 3/193 330/253 |
| 8,704,598 B2 * | 4/2014 | Kobayashi | H03F 3/345 330/296 |
| 8,824,983 B2 * | 9/2014 | Doherty | H03G 3/3047 455/127.1 |
| 9,118,279 B2 * | 8/2015 | Staudinger | H03G 3/3036 |
| 9,130,524 B2 * | 9/2015 | Park | H03F 3/193 |
| 9,362,870 B2 * | 6/2016 | Lam | H03F 1/0266 |
| 9,419,565 B2 * | 8/2016 | Nobbe | H04B 17/12 |
| 9,520,837 B1 * | 12/2016 | Choi | H03F 1/0222 |
| 9,602,066 B2 * | 3/2017 | Imazeki | H03F 3/193 |
| 9,608,576 B2 * | 3/2017 | Lam | H03F 1/0266 |
| 9,722,552 B2 * | 8/2017 | Kobayashi | H03F 3/345 |
| 9,729,107 B2 * | 8/2017 | Nobbe | H03F 1/0222 |
| 9,755,600 B1 * | 9/2017 | Turker Melek | H03F 1/0205 |
| 9,800,211 B2 * | 10/2017 | Nobbe | H04L 27/20 |
| 9,825,603 B2 * | 11/2017 | Kobayashi | H03F 3/604 |
| 9,831,840 B2 * | 11/2017 | Siniscalchi | H03F 3/45183 |
| 9,876,471 B2 * | 1/2018 | Modi | H03F 3/19 |
| 10,003,308 B2 * | 6/2018 | Lam | H03F 1/34 |
| 10,097,138 B2 | 10/2018 | Blednov | |
| 10,158,328 B2 * | 12/2018 | Nobbe | H03F 3/193 |
| 10,243,519 B2 * | 3/2019 | Dykstra | H03F 1/0227 |
| 10,250,197 B1 * | 4/2019 | Schultz | H03F 1/565 |
| 10,291,183 B1 * | 5/2019 | Syed | H04B 1/04 |
| 10,305,577 B2 * | 5/2019 | Bjorkman | H03F 3/245 |
| 10,320,336 B2 * | 6/2019 | Rogers | H03F 1/3241 |
| 10,404,216 B2 * | 9/2019 | Korol | H03F 3/245 |
| 10,461,867 B2 * | 10/2019 | Rodriguez-Perez | H03G 3/3084 |
| 10,778,156 B2 * | 9/2020 | Seebacher | H01L 24/48 |
| 11,070,171 B2 | 7/2021 | Datta et al. | |
| 11,101,773 B2 * | 8/2021 | Kondo | H03F 3/19 |
| 2015/0188496 A1 | 7/2015 | Kim | |
| 2015/0188500 A1 * | 7/2015 | Kang | H03F 1/223 330/293 |
| 2015/0311873 A1 | 10/2015 | Wang et al. | |
| 2015/0323964 A1 * | 11/2015 | Ichitsubo | H03G 3/3036 361/679.4 |
| 2016/0013766 A1 | 1/2016 | Kobayashi | |
| 2016/0365835 A1 | 12/2016 | Modi et al. | |
| 2017/0099038 A1 | 4/2017 | Kobayashi | |
| 2018/0123529 A1 * | 5/2018 | Jo | H03F 3/245 |
| 2018/0198420 A1 * | 7/2018 | D'Avino | H03F 3/213 |
| 2018/0367104 A1 * | 12/2018 | Seebacher | H03F 1/565 |
| 2019/0273470 A1 * | 9/2019 | Rogers | H03F 3/72 |
| 2020/0228064 A1 | 7/2020 | Datta et al. | |

FOREIGN PATENT DOCUMENTS

| | | |
|---|---|---|
| JP | 2016-208305 | 12/2016 |
| JP | 2019-087992 | 6/2019 |
| WO | WO 2020/146534 | 7/2020 |

OTHER PUBLICATIONS

International Preliminary Report on Patentability and Written Opinion for application No. PCT/US2020/012788, dated Jun. 16, 2021.

* cited by examiner

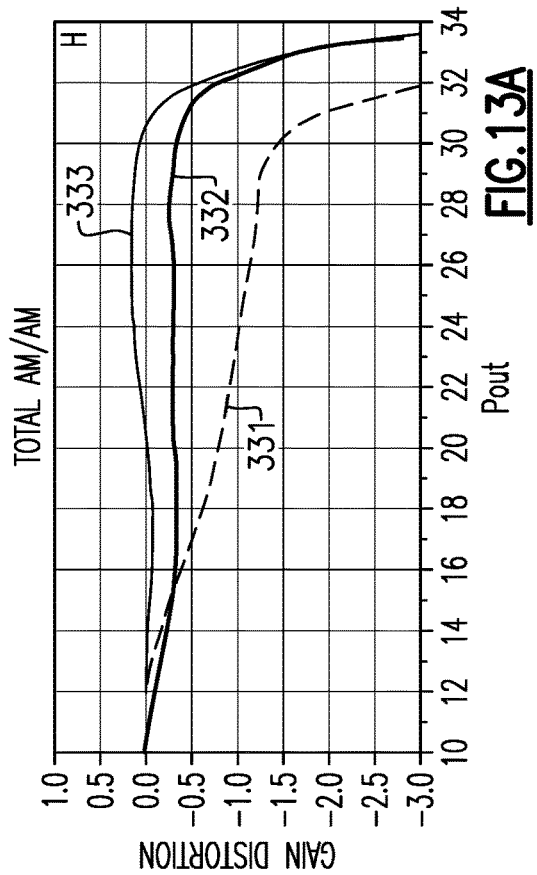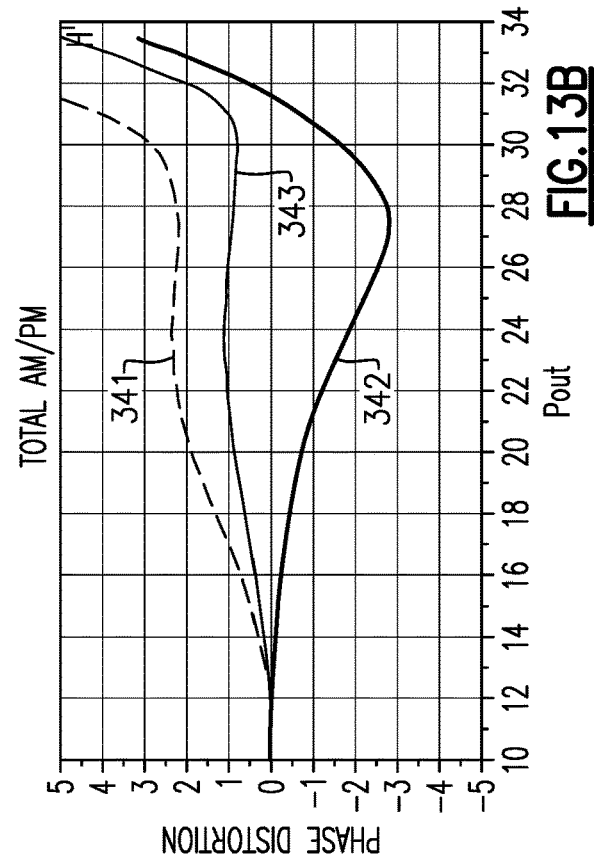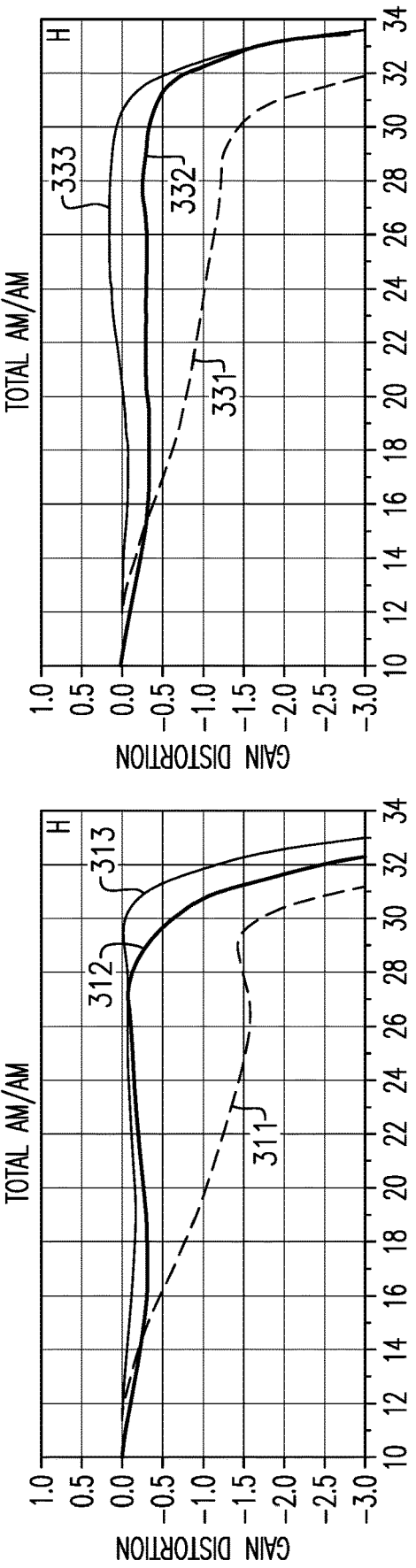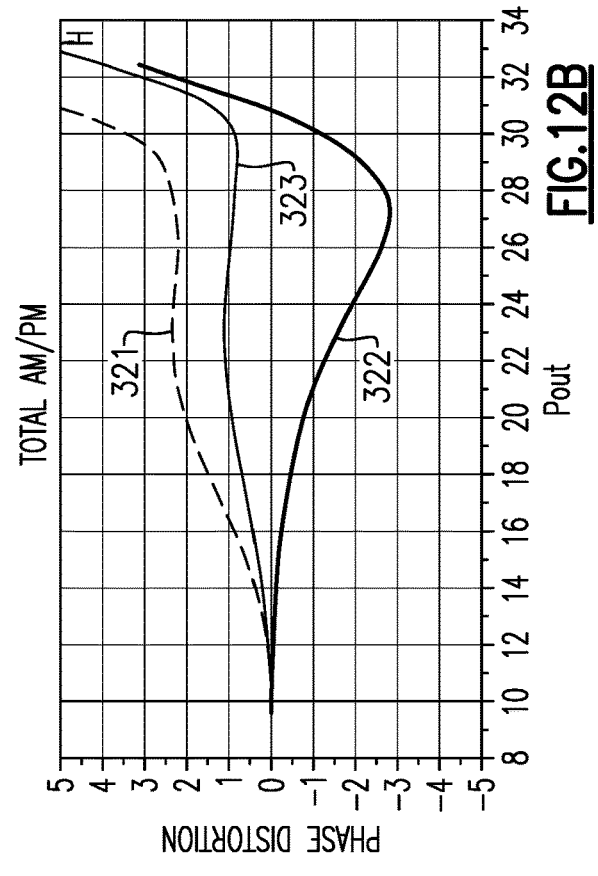

APPARATUS AND METHODS FOR BIASING OF POWER AMPLIFIERS

CROSS-REFERENCE TO RELATED APPLICATIONS

Any and all applications for which a foreign or domestic priority claim is identified in the Application Data Sheet, or any correction thereto, are hereby incorporated by reference under 37 CFR 1.57.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, for instance, in a range from about 450 MHz to about 90 GHz for certain communication standards.

SUMMARY

In certain embodiments, the present disclosure relates to a mobile device. The mobile device includes a transceiver configured to generate a radio frequency input signal, a front end system including a power amplifier configured to receive the radio frequency input signal and to output a radio frequency output signal, and an antenna configured to wirelessly transmit the radio frequency output signal. The power amplifier includes a power amplifier transistor configured to amplify the radio frequency input signal, and a bias network configured to bias an input of the power amplifier transistor with a DC bias voltage. The bias network has a reactance operable to flatten a phase response of the power amplifier.

In some embodiments, the reactance is operable to track an intrinsic input capacitance of the power amplifier transistor.

In various embodiments, the bias network includes a bias impedance electrically connected between the DC bias voltage and the input of the power amplifier transistor, and a shunt impedance electrically connected between the input of the power amplifier transistor and a reference voltage. According to several embodiments, the bias impedance includes a first resistor, and the shunt impedance includes a second resistor and a capacitor in series. In accordance with a number of embodiments, the shunt impedance further includes an inductor in series with the second resistor and the capacitor. According to some embodiments, the reference voltage is ground.

In a number of embodiments, the power amplifier transistor is a bipolar transistor having a base corresponding to the input.

In various embodiments, the power amplifier transistor is a field effect transistor having a gate corresponding to the input.

In some embodiments, the bias network includes a resistor and a capacitor electrically connected in parallel between the input of the power amplifier transistor and the DC bias voltage.

In several embodiments, the power amplifier transistor is implemented as a plurality of transistor elements operating in parallel with one another. According to a number of embodiments, the bias network includes a plurality of resistors and a plurality of capacitors, each of the plurality of resistors connected in parallel with a corresponding one of the plurality of capacitors between the DC bias voltage and an input to a corresponding one of the plurality of transistor elements.

In various embodiments, the bias network includes a series combination of a capacitor and an inductor electrically connected between the DC bias voltage and the input to the power amplifier transistor, and a resistor in parallel with the series combination of the capacitor and the inductor.

In a number of embodiments, the power amplifier includes an input stage and an output stage, the power amplifier transistor incorporated in the output stage of the power amplifier.

In certain embodiments, the present disclosure relates to a power amplifier system. The power amplifier system includes a bias control circuit configured to generate a DC bias voltage, and a power amplifier configured to receive a radio frequency input signal and to output a radio frequency output signal. The power amplifier including a power amplifier transistor configured to amplify the radio frequency input signal, and a bias network configured to bias an input of the power amplifier transistor with the DC bias voltage. The bias network has a reactance operable to flatten a phase response of the power amplifier.

In various embodiments, the reactance is operable to track an intrinsic input capacitance of the power amplifier transistor.

In several embodiments, the bias network includes a bias impedance electrically connected between the DC bias voltage and the input of the power amplifier transistor, and a shunt impedance electrically connected between the input of the power amplifier transistor and a reference voltage. According to a number of embodiments, the bias impedance includes a first resistor, and the shunt impedance includes a second resistor and a capacitor in series. In accordance with various embodiments, the shunt impedance further includes an inductor in series with the second resistor and the capacitor. According to some embodiments, the reference voltage is ground.

In some embodiments, the power amplifier transistor is a bipolar transistor having a base corresponding to the input.

In various embodiments, the power amplifier transistor is a field effect transistor having a gate corresponding to the input.

In a number of embodiments, the bias network includes a resistor and a capacitor electrically connected in parallel between the input of the power amplifier transistor and the DC bias voltage.

In several embodiments, the power amplifier transistor is implemented as a plurality of transistor elements operating in parallel with one another. According to various embodiments, the bias network includes a plurality of resistors and a plurality of capacitors, each of the plurality of resistors connected in parallel with a corresponding one of the plurality of capacitors between the DC bias voltage and an input to a corresponding one of the plurality of transistor elements.

In some embodiments, the bias network includes a series combination of a capacitor and an inductor electrically connected between the DC bias voltage and the input to the power amplifier transistor, and a resistor in parallel with the series combination of the capacitor and the inductor.

In various embodiments, the power amplifier includes an input stage and an output stage, the power amplifier transistor incorporated in the output stage of the power amplifier.

In certain embodiments, the present disclosure relates to a method of biasing a power amplifier. The method includes generating a DC bias voltage using a bias control circuit, receiving a radio frequency input signal as an input to a power amplifier, amplifying the radio frequency input signal using a power amplifier transistor of the power amplifier, and biasing an input of the power amplifier transistor with the DC bias voltage using a bias network of the power amplifier, including flattening a phase response of the power amplifier with a reactance of the bias network.

In some embodiments, the method further includes tracking an intrinsic input capacitance of the power amplifier transistor with the reactance of the bias network.

In several embodiments, the bias network includes a bias impedance electrically connected between the DC bias voltage and the input of the power amplifier transistor, and a shunt impedance electrically connected between the input of the power amplifier transistor and a reference voltage. According to a number of embodiments, the bias impedance includes a first resistor, and the shunt impedance includes a second resistor and a capacitor in series. In accordance with various embodiments, the shunt impedance further includes an inductor in series with the second resistor and the capacitor. According to several embodiments, the reference voltage is ground.

In various embodiments, the power amplifier transistor is a bipolar transistor having a base corresponding to the input.

In a number of embodiments, the power amplifier transistor is a field effect transistor having a gate corresponding to the input.

In several embodiments, the bias network includes a resistor and a capacitor electrically connected in parallel between the input of the power amplifier transistor and the DC bias voltage.

In some embodiments, the power amplifier transistor is implemented as a plurality of transistor elements operating in parallel with one another. According to several embodiments, the bias network includes a plurality of resistors and a plurality of capacitors, each of the plurality of resistors connected in parallel with a corresponding one of the plurality of capacitors between the DC bias voltage and an input to a corresponding one of the plurality of transistor elements. In accordance with various embodiments, the bias network includes a series combination of a capacitor and an inductor electrically connected between the DC bias voltage and the input to the power amplifier transistor, and a resistor in parallel with the series combination of the capacitor and the inductor. According to several embodiments, the power amplifier includes an input stage and an output stage, and the power amplifier transistor incorporated in the output stage of the power amplifier.

BRIEF DESCRIPTION OF THE DRAWINGS

FIG. 12A is another example of a graph of amplitude distortion versus output power.

FIG. 12B is another example of a graph of phase distortion versus output power.

FIG. 13A is another example of a graph of amplitude distortion versus output power.

FIG. 13B is another example of a graph of phase distortion versus output power.

DETAILED DESCRIPTION OF EMBODIMENTS

Figure 1:
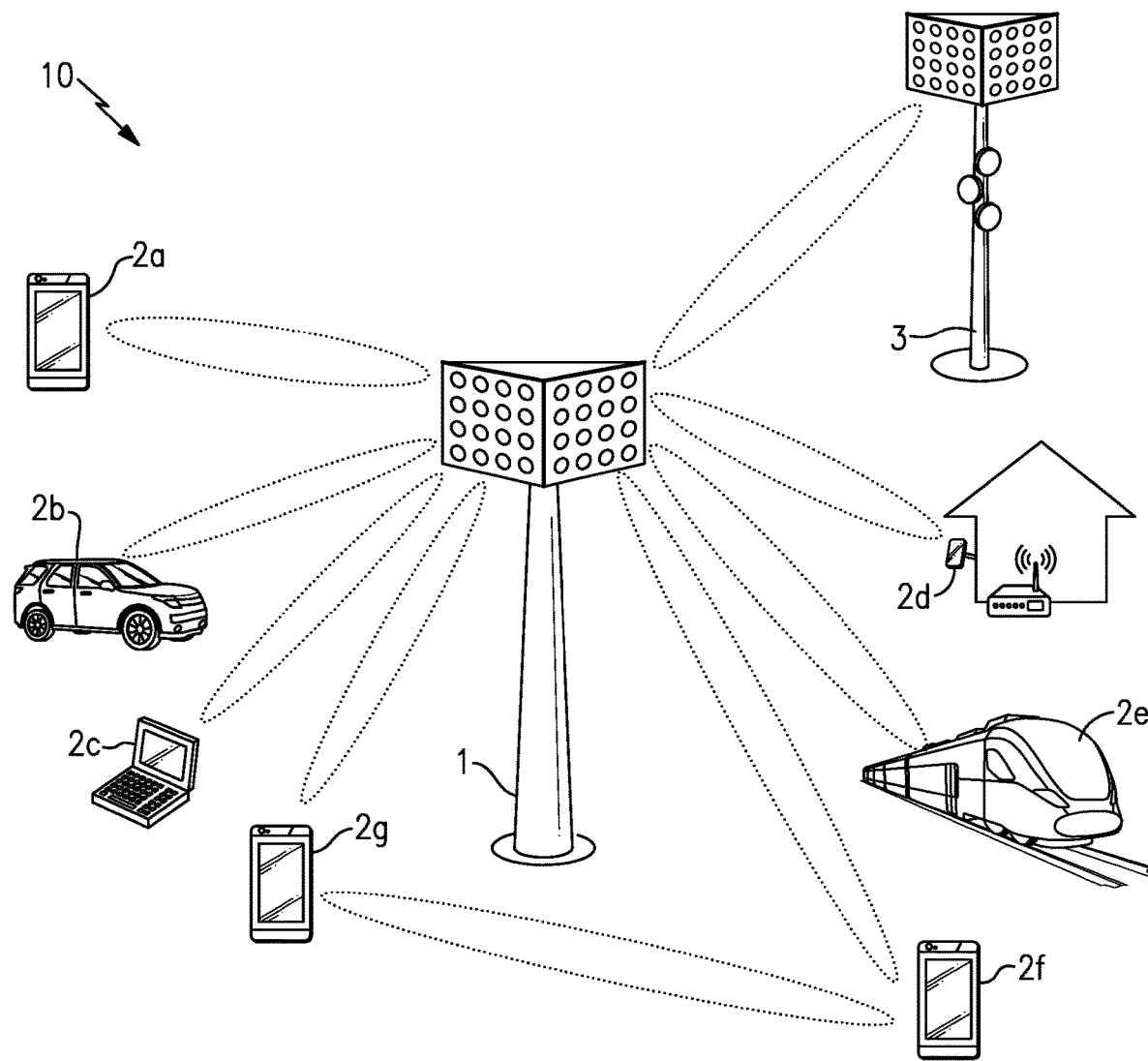
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2:
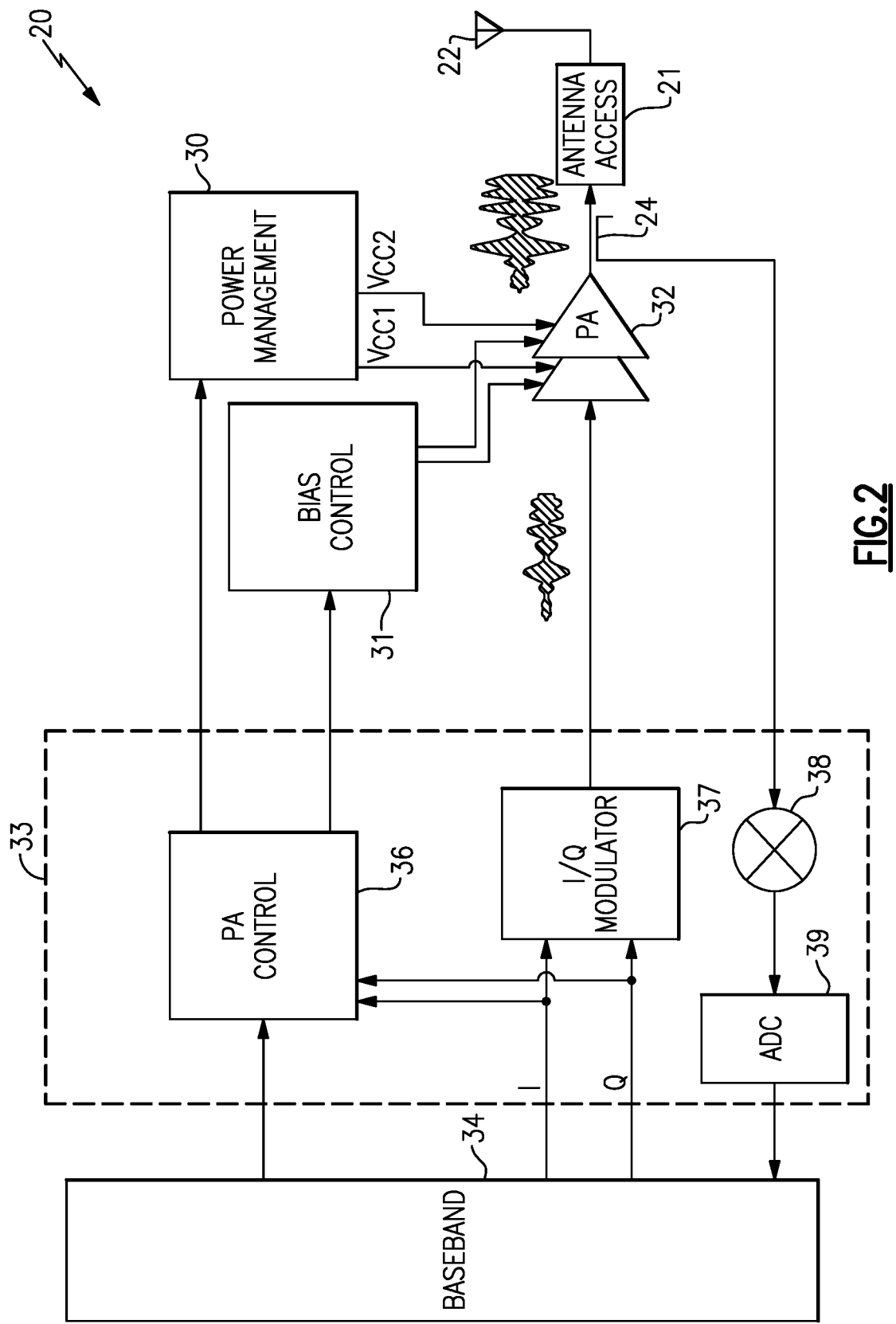
FIG. 2 is a schematic diagram of one embodiment of a power amplifier system.

FIG. 2 is a schematic diagram of one embodiment of a power amplifier system 20. The illustrated power amplifier system 20 includes an antenna access circuit 21, an antenna 22, a directional coupler 24, a power management circuit 30, a bias control circuit 31, a power amplifier 32, a transceiver 33, and a baseband processor 34.

Although FIG. 2 illustrates one embodiment of a power amplifier system, the teachings herein are applicable to power amplifier systems implemented in a wide variety of ways. For example, a power amplifier system can include more or fewer components, a different arrangement of components, and/or components implemented in different ways.

In the illustrated embodiment, the transceiver 33 includes a power amplifier control circuit 36, an I/O modulator 37, a mixer 38, and an analog-to-digital converter (ADC) 39. Although not illustrated in FIG. 2 for clarity, the transceiver 33 can also process signals received from one or more antennas (for example, the antenna 22 and/or other antenna(s)) by way of one or more receive paths. Furthermore, the transceiver 33 can be implemented in other ways, including, but not limited to, using different implementations of transmit path(s), observation path(s), and/or power amplifier control circuitry.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/O modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 20.

The I/O modulator 37 can be configured to receive the I and Q signals from the baseband processor 34 and to process the I and Q signals to generate an RF signal. For example, the I/O modulator 37 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 32. In certain implementations, the I/O modulator 37 can include one or more filters configured to filter frequency content of signals processed therein.

The power amplifier 32 can receive the RF signal from the I/O modulator 37, and when enabled can provide an amplified RF signal to the antenna 22 via the antenna access circuit 21. The antenna access circuit 21 can be implemented in a wide variety of ways, and can include, for example, one or more switches, filters, duplexers, diplexers, triplexers, quadplexers, circulators, and/or other components suitable for providing access to the antenna 22. The directional coupler 24 can be positioned between the output of the power amplifier 32 and the input of the antenna access circuit 21, thereby allowing an output power measurement of the power amplifier 32 that does not include insertion loss of the antenna access circuit 21. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 20. For example, configuring the power amplifier system 20 in this manner can aid in controlling the PAE and/or linearity of the power amplifier 32.

In the illustrated embodiment, the power management circuit 30 receives a power control signal from the transceiver 33, and controls the supply voltages of the power amplifier 32. In certain implementations, the transceiver 33 is electrically connected to the power management circuit 30 via a serial interface, and the power management circuit 30 receives the power control signal over the serial interface.

As shown in FIG. 2, the power management circuit 30 generates a first supply voltage $V_{CC1}$ for powering an input stage of the power amplifier 32 and a second supply voltage $V_{CC2}$ for powering an output stage of the power amplifier 32. The power management circuit 30 can control the voltage level of the first supply voltage $V_{CC1}$ and/or the second supply voltage $V_{CC2}$ to enhance the power amplifier system's PAE. Although an embodiment with two controllable supply voltages is shown, a power management circuit can control the voltage levels of more or fewer supply voltages. In certain implementations, a power amplifier operates with one or more controllable supply voltages and/or one or more substantially fixed supply voltages.

In the illustrated embodiment, the power control signal instructs the power management circuit 30 to operate in a particular supply control mode, such as an average power tracking mode, an envelope tracking mode, a fixed supply mode, or other suitable power management mode. Thus, the power amplifier control circuit 36 of the transceiver 33 controls the selected supply control mode, in this embodiment.

As shown in FIG. 2, the bias control circuit 31 receives a bias control signal from the transceiver 33, and generates bias control signals for the power amplifier 32. Additionally, the bias control circuit 31 generates the bias control signals (for instance, bias voltages) based on the bias control signal. In certain implementations, the transceiver 33 is electrically connected to the bias control circuit 31 via a serial interface, and the bias control signal corresponds to a control word received over the serial interface.

Figure 3:
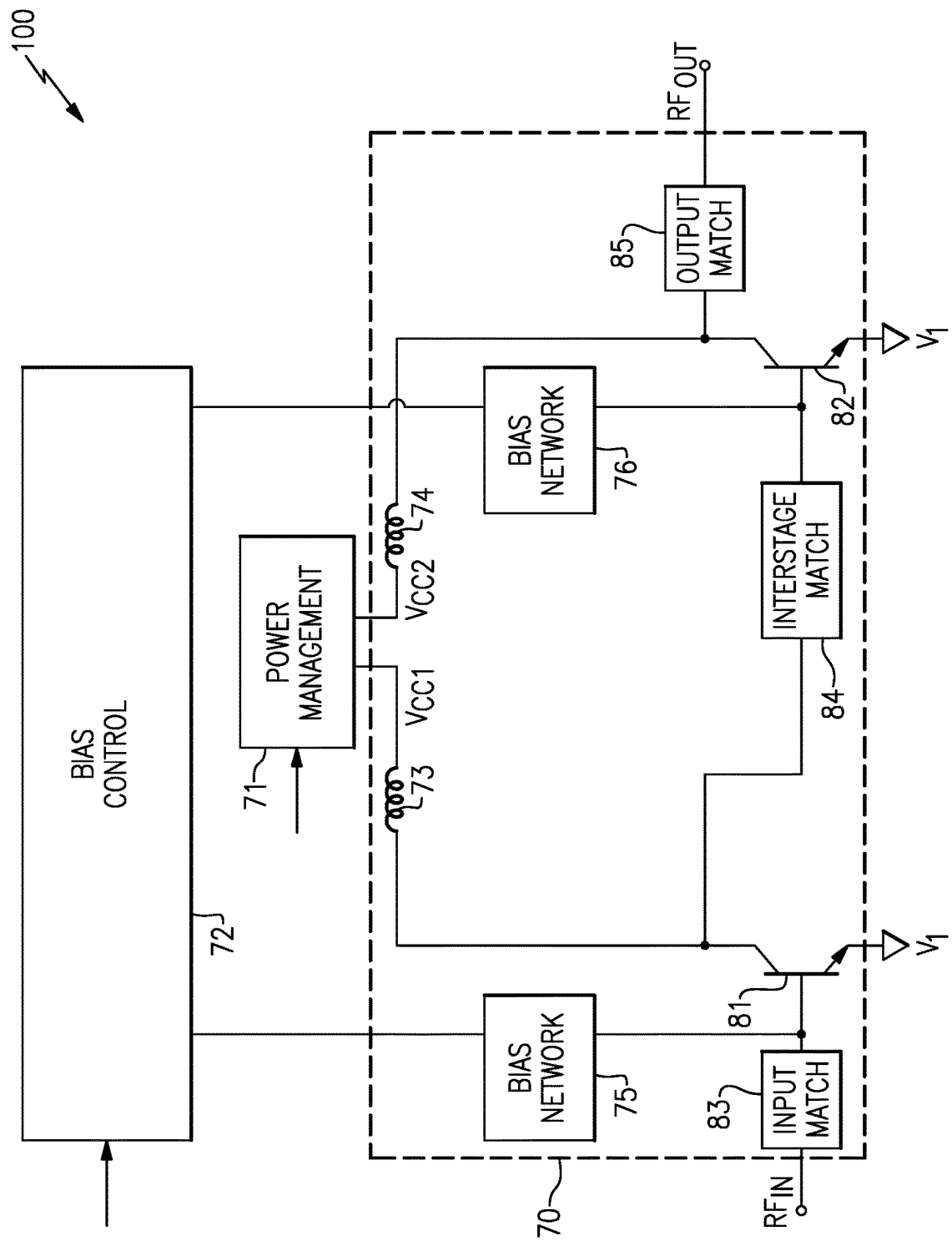
FIG. 3 is a schematic diagram of another embodiment of a power amplifier system.

FIG. 3 is a schematic diagram of another embodiment of a power amplifier system 100. The power amplifier system 100 includes a power amplifier 70, a power management circuit 71, and a bias control circuit 72.

Although FIG. 3 illustrates one embodiment of a power amplifier system, the teachings herein are applicable to power amplifier systems implemented in a wide variety of ways.

The power amplifier 70 includes a first supply inductor 73, and a second supply inductor 74, an input stage bias network 75, an output stage bias network 76, an input stage bipolar transistor 81, an output stage bipolar transistor 82, an input matching circuit 83, an interstage matching circuit 84, and an output matching circuit 85.

Although the illustrated power amplifier 70 includes two stages, other configurations are possible, including, for example, power amplifiers including one stage or power amplifiers including three or more stages. Although the illustrated power amplifier 70 is implemented using bipolar transistors, the teachings herein are also applicable to field-effect transistor configurations.

As shown in FIG. 3, the power amplifier 70 receives an RF input signal $RF_{in}$, which is amplified using the input stage bipolar transistor 81. A collector of the input stage bipolar transistor 81 generates an amplified RF signal, which is provided to a base of the output stage bipolar transistor 82. The output stage bipolar transistor 82 further amplifies the amplified RF signal to generate the RF output signal $RF_{out}$. As shown in FIG. 3, the emitters of the input stage bipolar transistor 81 and output stage bipolar transistor 82 are electrically connected to a first voltage $V_1$, which can be, for example, a ground voltage.

As will be appreciated by persons having ordinary skill in the art, the input matching circuit 83, the interstage matching circuit 84, and the output matching circuit 85 provide impedance matching, thereby enhancing RF performance. In certain implementations, the input matching circuit 83, the interstage matching circuit 84, and the output matching circuit 85 serve one or more additional functions, such as DC blocking.

The power amplifier 70 of FIG. 3 is powered using a first supply voltage $V_{CC1}$ and a second supply voltage $V_{CC2}$. The first supply inductor 73 is electrically connected between the first supply voltage $V_{CC1}$ and the collector of the input stage bipolar transistor 81, and the second supply inductor 74 is electrically connected between the second supply voltage $V_{CC2}$ and the collector of the output stage bipolar transistor 82. The first supply inductor 73 and the second supply inductor 74 can aid in powering the power amplifier 70, while providing impedance sufficient to block RF signals generated by the power amplifier 70 from reaching the first supply voltage $V_{CC1}$ and the second supply voltage $V_{CC2}$.

In certain implementations, the power management circuit 71 is operable in a selected supply control mode, such as an average power tracking (APT) mode, an envelope tracking (ET) mode, a fixed supply mode, or other suitable power management mode. Additionally, the power management circuit 71 receives a power control signal that instructs the power management circuit 71 to operate in a selected supply control mode. In one embodiment, the power control signal is received over a serial interface, such as a Mobile Industry Processor Interface (MIPI) RF front end (RFFE) bus.

As shown in FIG. 3, the power management circuit 71 generates a first supply voltage $V_{CC1}$ for powering the input stage bipolar transistor 81 of the power amplifier 70 and a second supply voltage $V_{CC2}$ for powering the output stage bipolar transistor 82 of the power amplifier 70.

The power management circuit 71 controls the voltage levels of the first supply voltage $V_{CC1}$ and/or the second supply voltage $V_{CC2}$ based on the selected supply control mode. In one example, when the selected supply control mode is an envelope tracking mode, the power management circuit 71 controls the voltage levels of the first supply voltage $V_{CC1}$ and/or the second supply voltage $V_{CC2}$ to track a signal envelope of the signal $RF_{in}$ amplified by the power amplifier 70. In another example, when the selected supply control mode is an average power tracking mode, the power management circuit 71 controls the voltage levels of the first supply voltage $V_{CC1}$ and/or the second supply voltage $V_{CC2}$ based on an average output power of the power amplifier 70.

The input stage bias network 75 is used to provide an input stage bias voltage from the bias control circuit 72 to the base of the input stage bipolar transistor 81. Additionally, the output stage bias network 76 is used to provide an output stage bias voltage from the bias control circuit 72 to the base of the output stage bipolar transistor 82. In the illustrated embodiment, the bias control circuit 72 controls a voltage level of the input stage bias voltage and a voltage level of the output stage bias voltage. Additionally, the bias control circuit 72 receives a bias control signal, which includes information indicating the selected bias voltage levels. In one embodiment, the bias control signal is received over a serial interface, such as a MIPI RFFE bus.

The power amplifier 70 includes an input stage bias network 75 for biasing the input stage bipolar transistor 81 and an output stage bias network 76 for biasing the output stage bipolar transistor 82. The input stage bias network 75 and/or the output stage bias network 76 can be implemented in accordance with any of the embodiments herein.

Apparatus and methods for biasing power amplifiers are provided herein. In certain embodiments, a power amplifier includes a bipolar transistor having a base biased by a bias network having a reactance that controls an impedance at the transistor base to achieve substantially flat phase response over large dynamic power levels. For example, the bias network can have a frequency response, such as a high-pass or band-pass response, that reduces the impact of power level on phase distortion (AM/PM).

In a first example, the bias network is implemented to provide a low impedance path at RF frequencies to thereby maintain a flat phase response over large dynamic power levels. In a second example, the bias network serves to reduce the impact of a non-linear part of the bipolar transistor's active intrinsic capacitor (for instance, a base junction capacitance) by tracking or shadowing it with a lower impedance at RF frequency. Thus, an effect of large transistor capacitance variation under high current biasing is suppressed, and a substantially flat phase response and a substantially flat amplitude response are simultaneously achieved. In a third example, the bias network serves to decouple RF performance from the DC biasing point, and allows the use of high ballast resistors for DC biasing. By using high resistance ballasting, large-signal ruggedness of the power amplifier is improved and/or power amplifier stability is enhanced.

Accordingly, the bias networks herein can be used to control the phase response of power amplifiers, for instance, broadband linear power amplifiers operating over large dynamic power ranges. For instance, the use of the bias networks herein can enable support of wideband 5G modulations, for instance, 100 MHz CP-OFDM waveforms necessitating substantially flat phase response over large peak to average power (PAPR) ratios. Moreover, enhanced phase response is achieved without needing to degrade ruggedness and/or stability.

In contrast, certain conventional power amplifiers maintain a flat amplitude response to achieve good linearity. However, a flat amplitude response achieved by transistor biasing with high quiescent current comes at the cost of a non-monotonically increasing phase response. Such trade-offs affect the performance of wideband phase sensitive modulations, such as those used in certain 4G LTE carrier aggregation scenarios. Moreover, 5G modulations supporting 100 MHz signal bandwidth have an even more sensitive phase response.

The teachings herein also provide wideband characteristics with relatively flat phase response in power amplifiers substantially independent of amplitude response. Thus, such techniques aid in support 5G waveform with good linearity and efficiency with relatively low cost and complexity.

Figure 4:
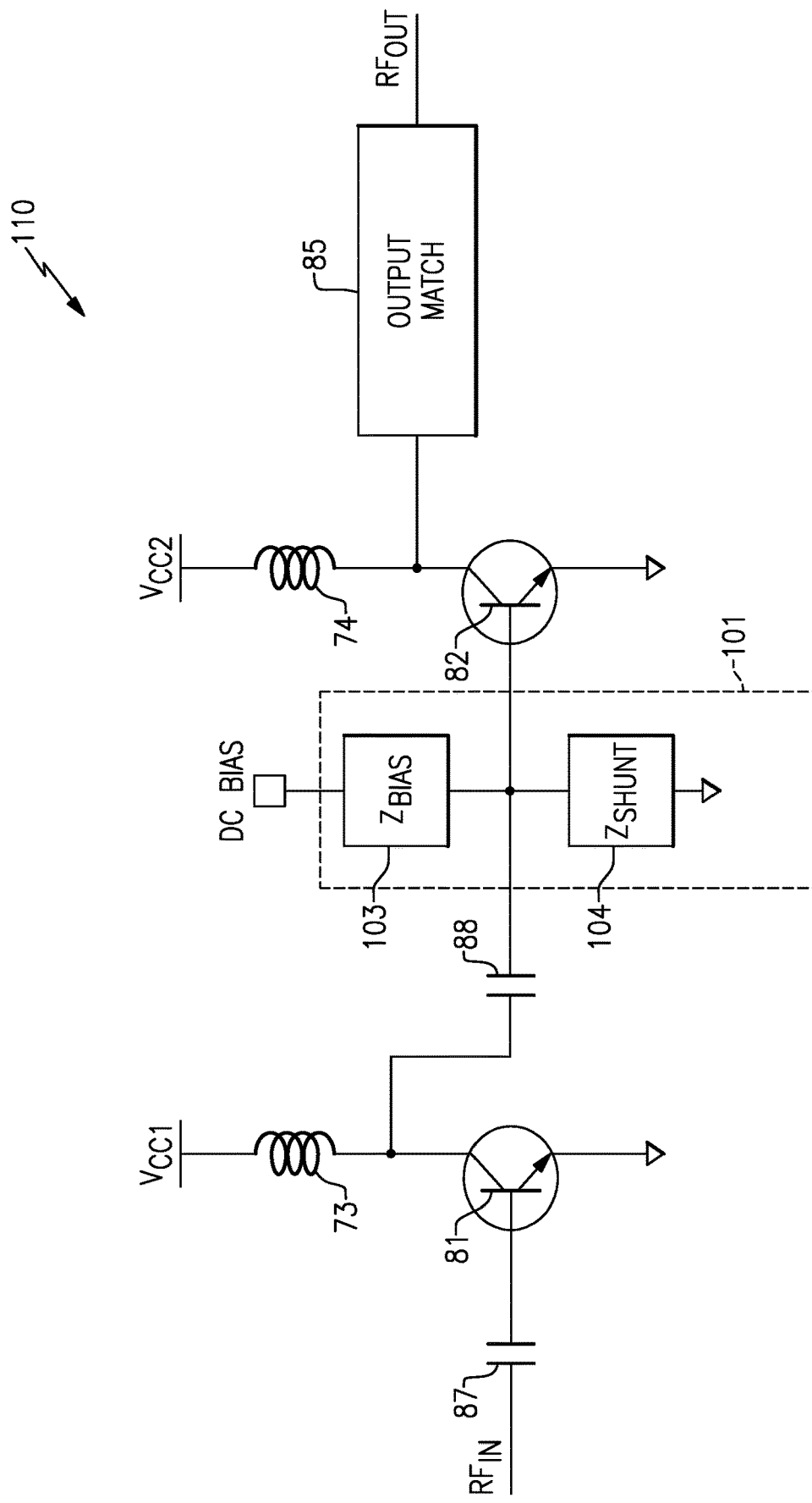
FIG. 4 is a schematic diagram of a power amplifier according to one embodiment.

FIG. 4 is a schematic diagram of a power amplifier 110 according to one embodiment. The power amplifier 110 includes a first supply inductor 73, a second supply inductor 74, a first bipolar transistor 81, a second bipolar transistor 82, an output matching circuit 85, an input capacitor 87, an interstage capacitor 88, and a bias network 101.

Although one embodiment of a power amplifier is depicted, the teachings herein are applicable to power amplifiers implemented in a wide variety of ways. For example, a power amplifier can include more or fewer stages, different implementations of impedance matching, and/or different implementations of DC blocking. Moreover, although the power amplifier 110 of FIG. 4 is implemented using bipolar transistors, the teachings herein are also applicable to power amplifiers implemented using FETs. For example, any of the bias networks disclosed herein can be used for providing a bias voltage to a gate of a FET. Accordingly, other implementations are possible.

In the illustrated embodiment, the bias network 101 includes a bias impedance 103 and a shunt impedance 104. At least one of the bias impedance 103 or the shunt impedance 104 includes a reactance to aid in flattening a phase response of the power amplifier 110. Thus rather than having a purely resistive biasing network (for instance, a ballast resistor alone), the bias networks herein have a reactance operable to flatten a power amplifier's phase response, thereby enhancing performance.

The bias impedance 103 is connected between the base of the output stage bipolar transistor 82 and a DC bias voltage from a bias control circuit, such as the bias control circuit 72 of FIG. 3. Additionally, the shunt impedance 104 is connected between the base of the output stage bipolar transistor 82 and a DC voltage such as ground. In certain implementations, the DC voltage corresponds to the DC bias voltage such that the bias impedance 103 and the shunt impedance 104 are electrically connected in parallel with one another.

For clarity of the figures, biasing of the input stage bipolar transistor 81 is not depicted in FIG. 4. However, the input stage bipolar transistor 81 can be biased in a wide variety of ways, including, but not limited to, using a ballast resistor connected between the base of the input stage bipolar transistor 81 and an input bias voltage (for instance, provided by the bias control circuit 72 of FIG. 3). In certain implementations, the input stage bipolar transistor is biased with a bias network that includes a bias impedance and a shunt impedance implemented in accordance with the teachings herein. For example, a replica or copy of the bias network 101 (with suitable impedance values selected for the bias impedance 103 and the shunt impedance 104) can be included for biasing the input stage bipolar transistor 81.

Implementing the bias network 101 with the bias impedance 103 and the shunt impedance 104 provides a number of advantages. For example, the bias impedance 103 and the shunt impedance 104 controls an impedance at the base of the output stage transistor 82 to achieve substantially flat phase response over large dynamic power levels. For example, impedance values can be selected to reduce AM/PM.

In certain implementations, the shunt impedance 104 serves to provide a low impedance path at RF frequencies to thereby maintain a flat phase response over large dynamic power levels. Additionally or alternatively, the shunt impedance 104 can serve to reduce the impact of a non-linear part of the base capacitance of the output sage bipolar transistor 82 by shadowing the capacitance with a lower impedance at RF frequency. Thus, an effect of large transistor capacitance variation under high current biasing is suppressed, and a substantially flat phase response and a substantially flat amplitude response are simultaneously achieved.

Figure 5:
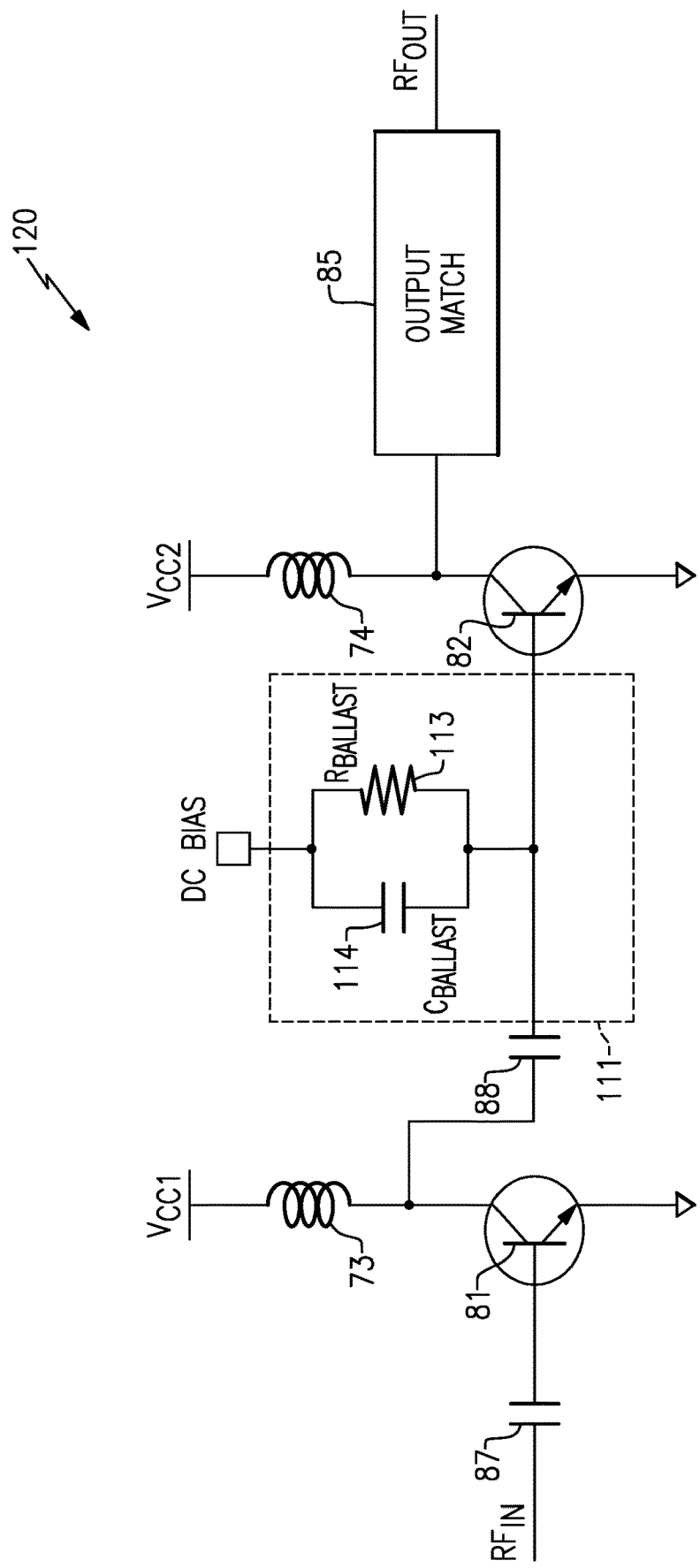
FIG. 5 is a schematic diagram of a power amplifier according to another embodiment.

FIG. 5 is a schematic diagram of a power amplifier 120 according to another embodiment. The power amplifier 120 includes a first supply inductor 73, a second supply inductor 74, a first bipolar transistor 81, a second bipolar transistor 82, an output matching circuit 85, an input capacitor 87, an interstage capacitor 88, and a bias network 111.

Although one embodiment of a power amplifier is depicted, the teachings herein are applicable to power amplifiers implemented in a wide variety of ways.

In the illustrated embodiment, the bias network includes a ballast resistor 113 ($R_{Ballast}$) and a ballast capacitor 114 ($C_{Ballast}$) electrically connected in parallel with one another between a DC bias voltage and the base of the output stage bipolar transistor 82.

The ballast resistor 113 serves to enhance the ruggedness of the power amplifier 120. However, absence compensation, the ballast resistor 113 can lead to a degradation in phase distortion performance. In the illustrated embodiment, the ballast capacitor 114 has been included in parallel with the ballast resistor 113 to provide a low impedance path at RF frequencies to thereby maintain a flat phase response over large dynamic power levels.

Accordingly, the bias network 111 can serve to decouple RF performance from the DC biasing point, thereby allowing the ballast resistor 113 to have a high resistance without leading to a corresponding degradation in AM/PM. Rather, flat phase performance characteristics over large dynamic power ranges can be achieved, while also achieved large-signal ruggedness and stable operation.

Figure 6:
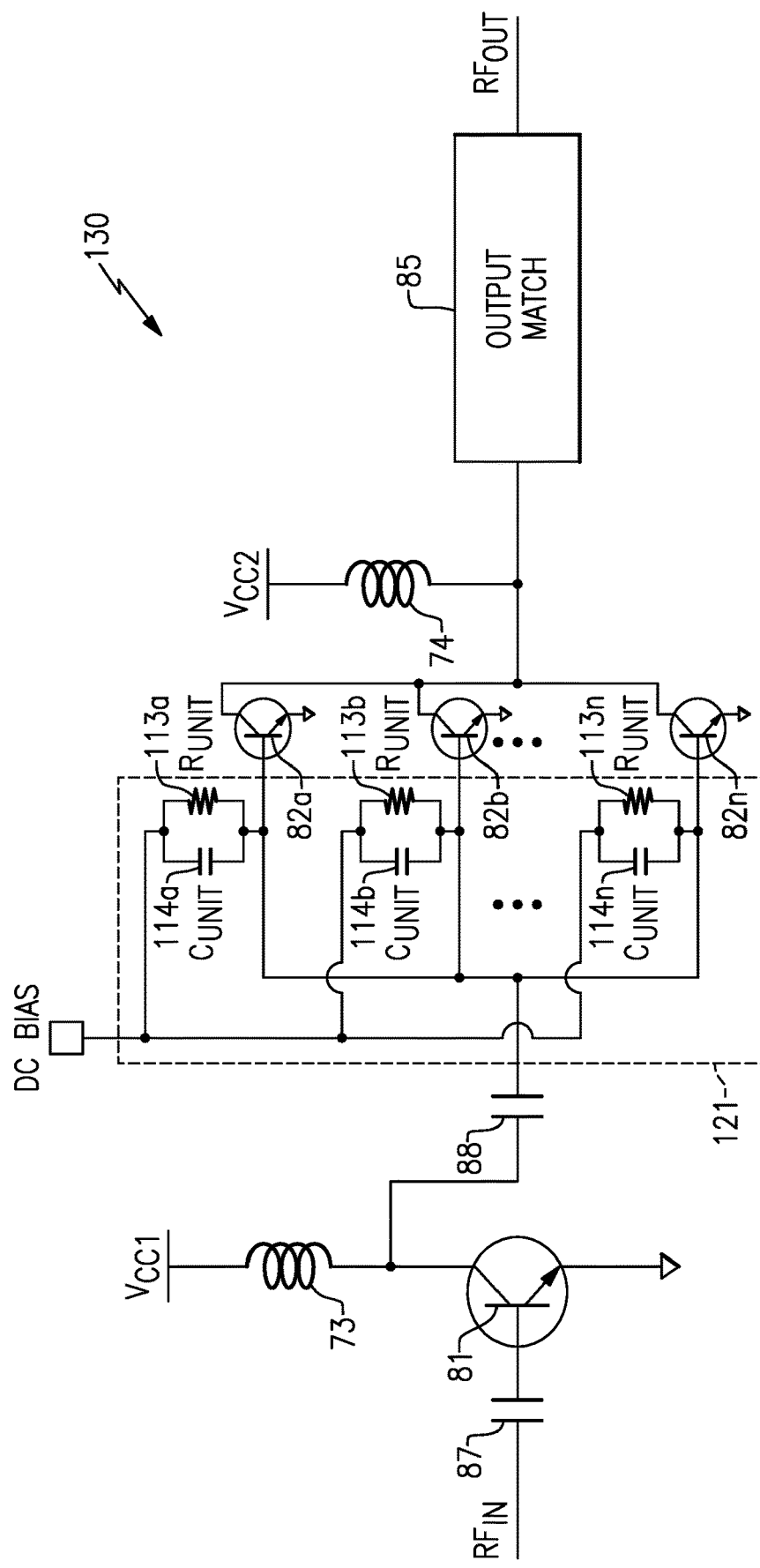
FIG. 6 is a schematic diagram of a power amplifier according to another embodiment.

FIG. 6 is a schematic diagram of a power amplifier 130 according to another embodiment. The power amplifier 130 includes a first supply inductor 73, a second supply inductor 74, a first bipolar transistor 81, a second bipolar transistor 82, an output matching circuit 85, an input capacitor 87, an interstage capacitor 88, and a bias network 121.

Although one embodiment of a power amplifier is depicted, the teachings herein are applicable to power amplifiers implemented in a wide variety of ways.

The power amplifier 130 of FIG. 6 is similar to the power amplifier 120 of FIG. 5, except that the power amplifier 130 illustrates an implementation in which the output stage bipolar transistor and the bias network have been segmented (into an integer N segments, in this example, where N is 2 or more).

For example, as shown in FIG. 6, the output stage bipolar transistor is implemented as transistor elements 82a, 82b, . . . 82n that are electrically connected in parallel with one another. Additionally, the bias network 121 includes ballast resistors 113a, 113b, . . . 113n connected in parallel with corresponding ballast capacitors 114a, 114b, . . . 114n between the DC bias voltage and transistor elements 82a, 82b, . . . 82n, respectively. In this example, the ballast resistors 113a, 113b, . . . 113n each have a resistance $R_{UNIT}$, while the ballast capacitors 114a, 114b, . . . 114n each have a capacitance $C_{UNIT}$.

By segmenting the power amplifier in this manner, superior bypassing of ballast resistance at high frequency is provided, thereby providing stronger phase control. Any of the bias networks/power amplifiers disclosed herein can be implemented with segmenting.

Figure 7:
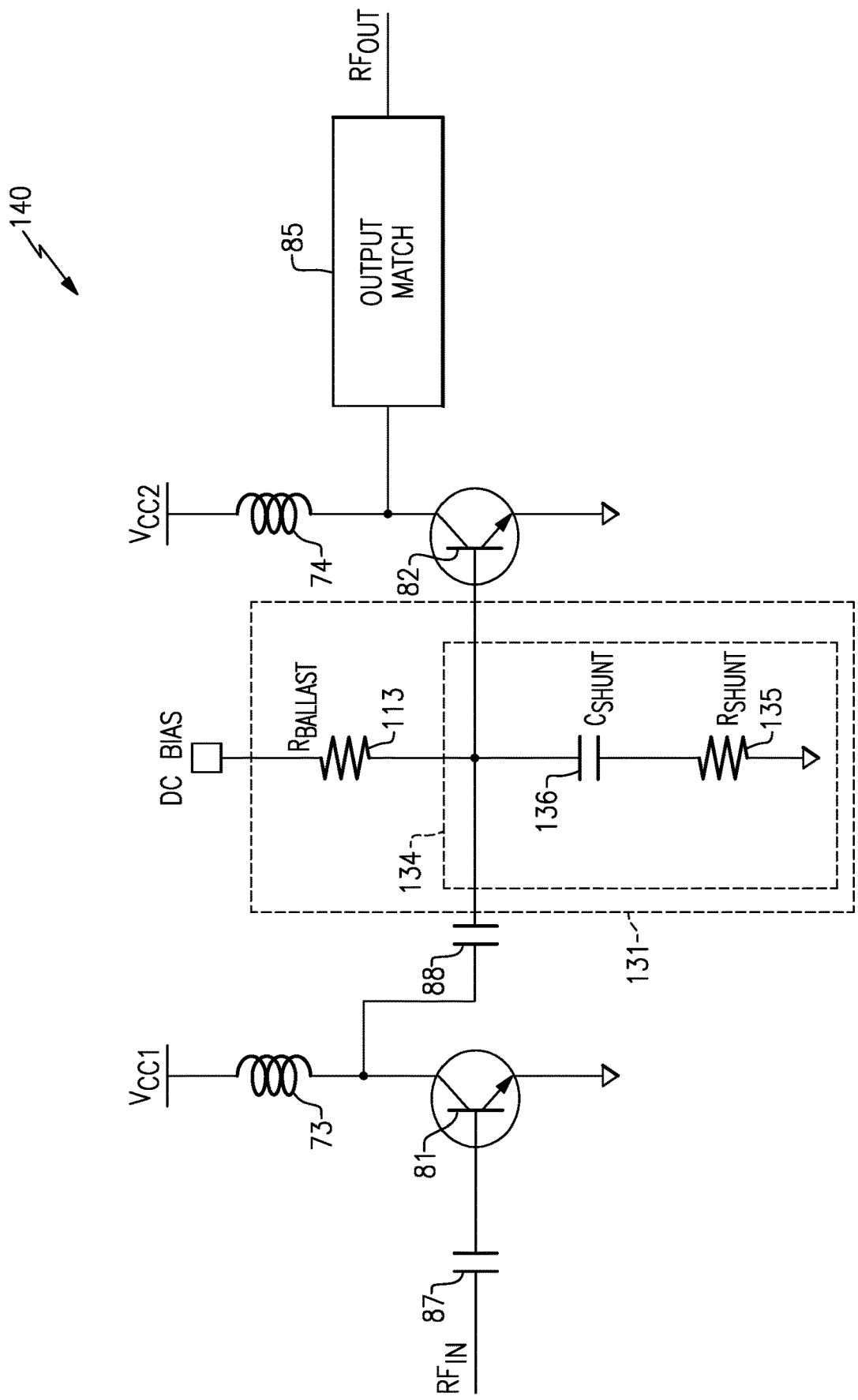
FIG. 7 is a schematic diagram of a power amplifier according to another embodiment.

FIG. 7 is a schematic diagram of a power amplifier 140 according to another embodiment. The power amplifier 140 includes a first supply inductor 73, a second supply inductor 74, a first bipolar transistor 81, a second bipolar transistor 82, an output matching circuit 85, an input capacitor 87, an interstage capacitor 88, and a bias network 131.

Although one embodiment of a power amplifier is depicted, the teachings herein are applicable to power amplifiers implemented in a wide variety of ways.

The power amplifier 140 of FIG. 7 is similar to the power amplifier 110 of FIG. 4, except that the bias network 131 of FIG. 7 includes specific implementations of the bias impedance 103 and the shunt impedance 104 of FIG. 4.

For example, as shown in FIG. 7, the bias network 181 includes a ballast resistor 113 electrically connected between the base of the output stage bipolar transistor 82 and the DC bias voltage, and a shunt impedance 134 electrically connected between the base of the output stage bipolar transistor 82 and a reference voltage, such as ground. In the illustrated embodiment, the shunt impedance 134 includes a shunt resistor 135 and a shunt capacitor 136 electrically connected in series.

The shunt capacitor 136 aids in providing low impedance at RF frequencies, thereby maintaining a flat phase response over large dynamic power levels. Furthermore, the shunt capacitor 136 reduces the impact of a non-linear part of the base capacitance of the output sage bipolar transistor 82 by shadowing the capacitance with a lower impedance at RF frequency. Furthermore, the shunt resistor 135 aids in controlling how much AC current passes through the shunt impedance 134.

Figure 8:
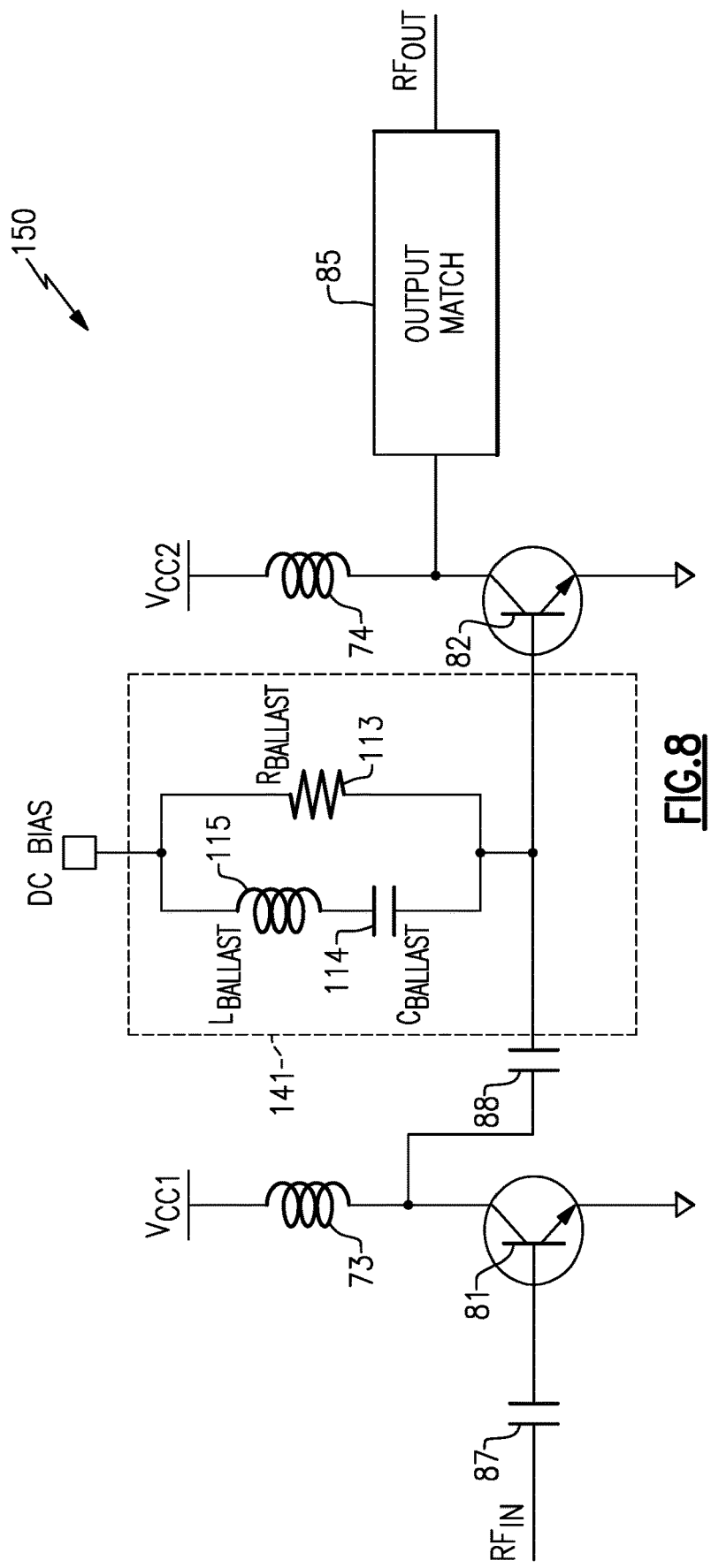
FIG. 8 is a schematic diagram of a power amplifier according to another embodiment.

FIG. 8 is a schematic diagram of a power amplifier 150 according to another embodiment. The power amplifier 150 includes a first supply inductor 73, a second supply inductor 74, a first bipolar transistor 81, a second bipolar transistor 82, an output matching circuit 85, an input capacitor 87, an interstage capacitor 88, and a bias network 141.

Although one embodiment of a power amplifier is depicted, the teachings herein are applicable to power amplifiers implemented in a wide variety of ways.

The power amplifier 150 of FIG. 8 is similar to the power amplifier 120 of FIG. 5, except that the bias network 141 of FIG. 8 further includes a ballast inductor ($L_{Ballast}$) 115 in series with the ballast capacitor 114.

Implementing the bias network 141 in this manner aids in providing low impedance at a resonant frequency of the ballast capacitor 114 and the ballast inductor 115, which can have component values selected to attenuate or reject noise at a particular frequency.

Furthermore, including the ballast inductor 115 provides an addition degree of control in the frequency response of the bias network 141, thereby helping to achieve a desired frequency characteristic for a particular application and/or implementation. For example, a bandpass response can be provided at the base node, with $R_{Ballast}$ chosen for DC bias point and with $C_{Ballast}$ and $L_{Ballast}$ value-pair (for instance, an inductance and capacitance product) chosen for phase response at RF frequencies.

Figure 9:
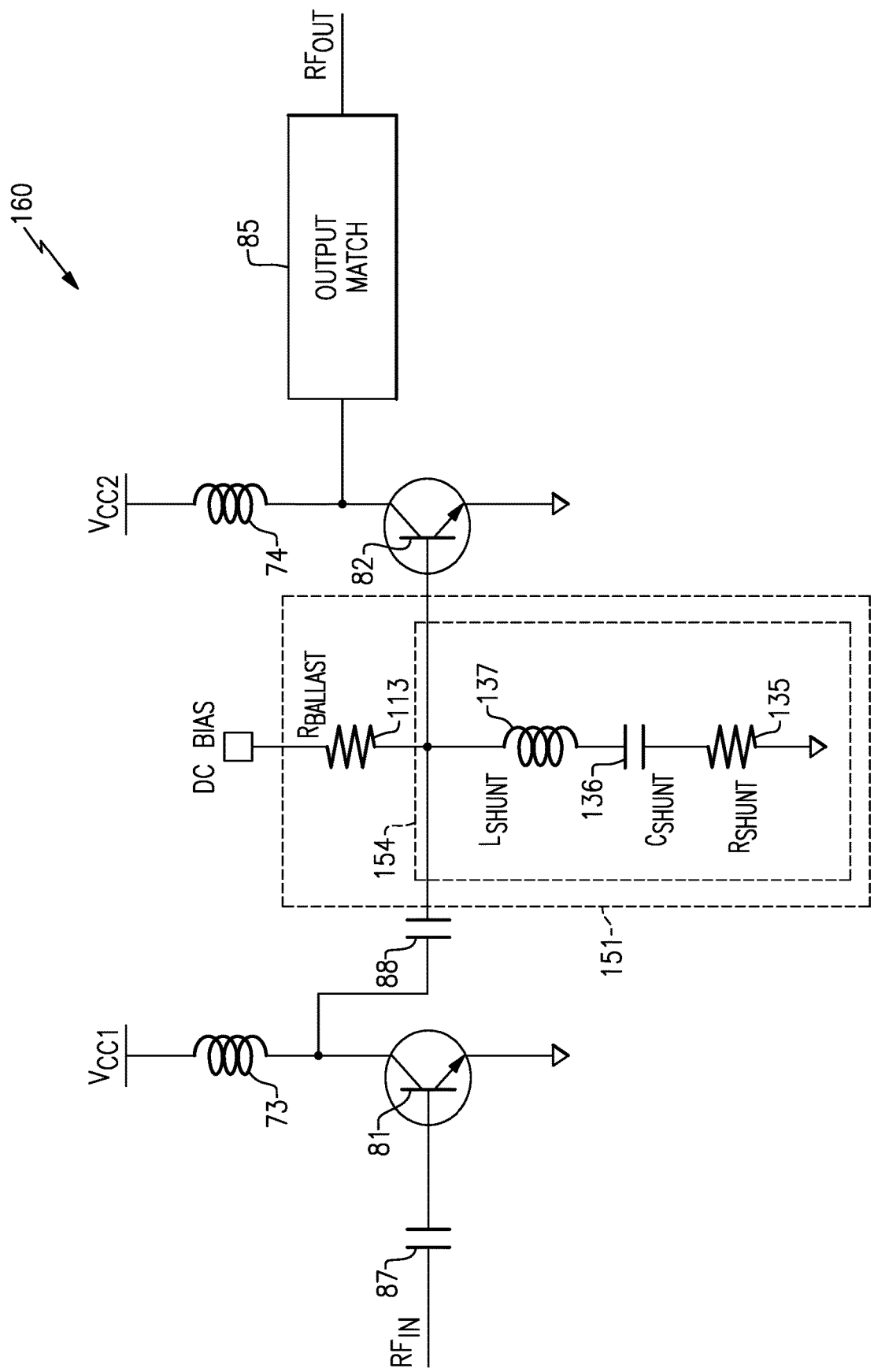
FIG. 9 is a schematic diagram of a power amplifier according to another embodiment.

FIG. 9 is a schematic diagram of a power amplifier 160 according to another embodiment. The power amplifier 160 includes a first supply inductor 73, a second supply inductor 74, a first bipolar transistor 81, a second bipolar transistor 82, an output matching circuit 85, an input capacitor 87, an interstage capacitor 88, and a bias network 151.

Although one embodiment of a power amplifier is depicted, the teachings herein are applicable to power amplifiers implemented in a wide variety of ways.

The power amplifier 160 of FIG. 9 is similar to the power amplifier 140 of FIG. 7, except that the bias network 151 of FIG. 9 includes a shunt impedance 154 that further includes a shunt inductor ($L_{Shunt}$) 137 in series with the shunt resistor 135 and the shunt capacitor 136.

Implementing the bias network 141 in this manner provides an addition degree of control in the frequency response of the bias network 151, thereby helping to achieve a desired frequency characteristic for a particular application and/or implementation. For example, the shunt impedance 154 can provide a band-pass response providing low impedance at particular frequencies, for instance, RF fundamental or harmonic frequencies.

Figure 10:
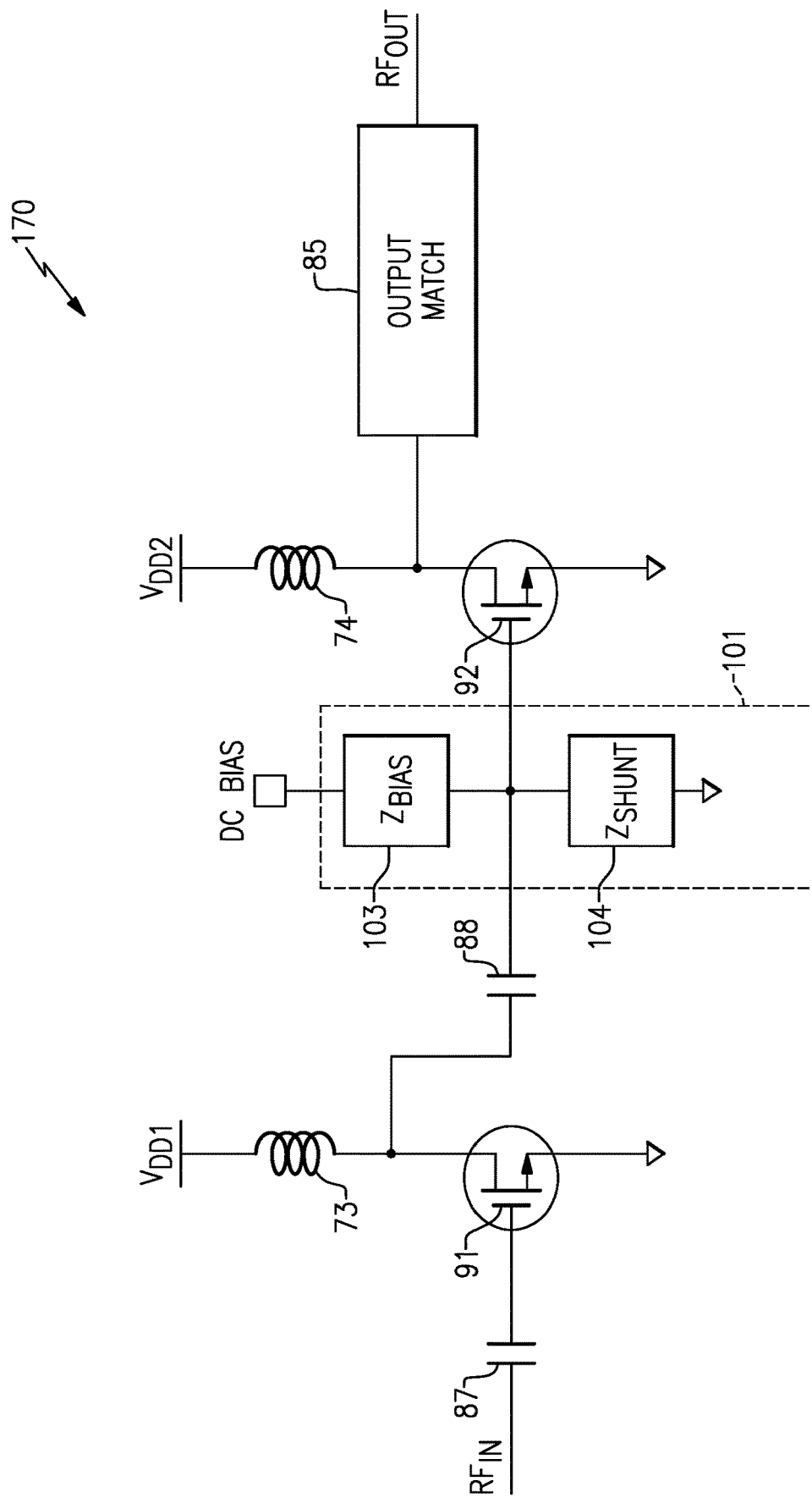
FIG. 10 is a schematic diagram of a power amplifier according to another embodiment.

FIG. 10 is a schematic diagram of a power amplifier 170 according to another embodiment. The power amplifier 170 includes a first supply inductor 73, a second supply inductor 74, an input stage FET 91, an output stage FET 92, an output matching circuit 85, an input capacitor 87, an interstage capacitor 88, and a bias network 101.

Although one embodiment of a power amplifier is depicted, the teachings herein are applicable to power amplifiers implemented in a wide variety of ways.

The power amplifier 170 of FIG. 10 is similar to the power amplifier 110 of FIG. 4, except that the power amplifier 170 of FIG. 10 is implemented with the input stage FET 91 and the output stage FET 92 rather than the input stage bipolar transistor 81 and the output stage bipolar transistor 82, respectively. Although the power amplifier 170 of FIG. 10 illustrates one embodiment of a power amplifier implemented with FETs, any of the power amplifiers herein can be implemented with FETs. For example, any of the power amplifiers of FIGS. 3-9 can be implemented with FETs rather than bipolar transistors. Furthermore, a power amplifier can include a combination of bipolar and field-effect transistors.

Figure 11A:
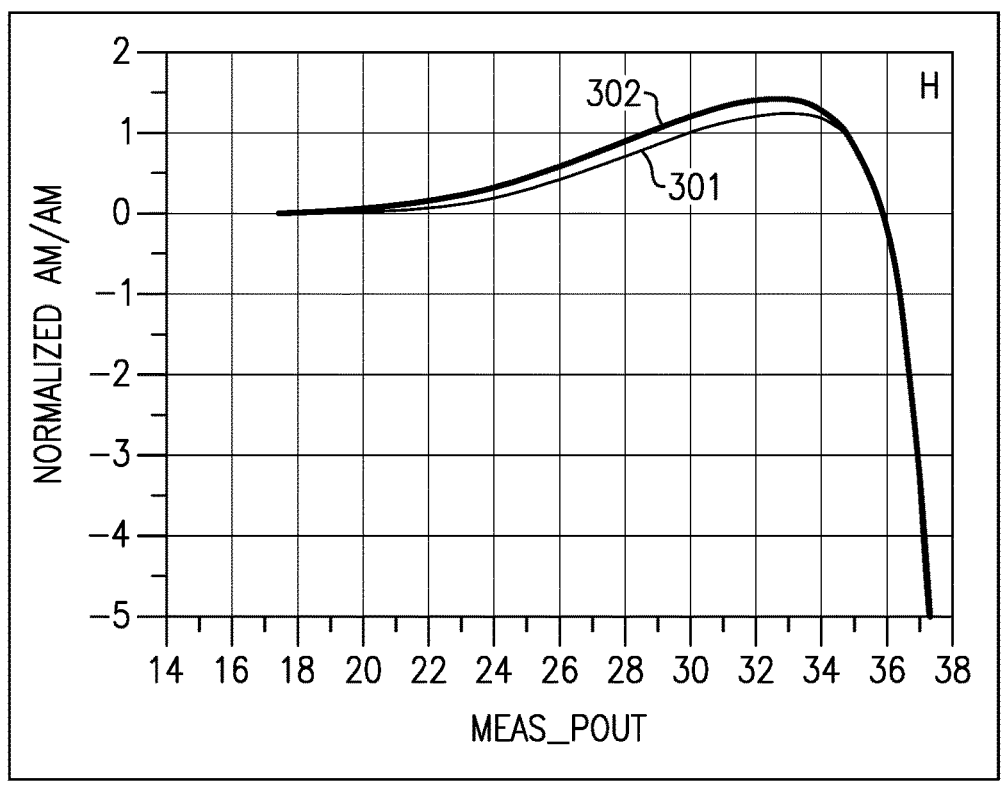
FIG. 11A is one example of a graph of amplitude distortion versus output power.

FIG. 11A is one example of a graph of amplitude distortion versus output power. FIG. 11A compares measured output power for a power amplifier biased by a ballast resistor alone (line 301) and for a power amplifier biased by one implementation of the biasing shown in FIG. 6 (line 302). As shown in FIG. 11A, the gain distortion (AM/AM) is similar for line 301 and line 302.

Figure 11B:
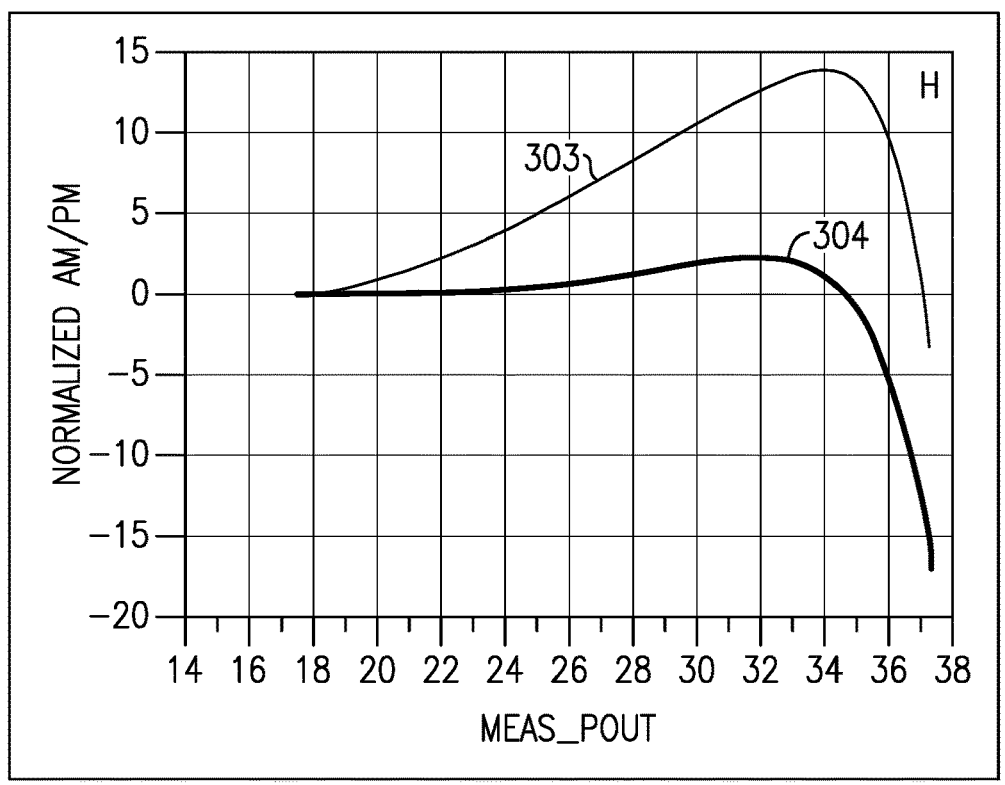
FIG. 11B is one example of a graph of phase distortion versus output power.

FIG. 11B is one example of a graph of phase distortion versus output power. FIG. 11A compares measured phase response for a power amplifier biased by a ballast resistor alone (line 303) and for a power amplifier biased by one implementation of the biasing shown in FIG. 6 (line 304). As shown in FIG. 11B, the phase distortion (AM/PM) is superior for the line 304 relative to the line 303.

FIG. 12A is another example of a graph of amplitude distortion versus output power. The graph depicts simulated amplitude distortion for a power amplifier biased by a ballast resistor alone (line 311) and for a power amplifier biased with two example implementations of the biasing shown in FIG. 5 with difference capacitance values (lines 312 and 313). The simulation is depicted for Band 71.

FIG. 12B is another example of a graph of phase distortion versus output power. The graph depicts simulated phase distortion for a power amplifier biased by a ballast resistor alone (line 321) and for a power amplifier biased with two example implementations of the biasing shown in FIG. 5 with difference capacitance values (lines 322 and 323). The simulation is depicted for Band 71.

FIG. 13A is another example of a graph of amplitude distortion versus output power. The graph is similar to the simulation of FIG. 12A, except that the simulation is depicted for Band 12. The graph includes lines 331, 332, and 333 corresponding to line lines 311, 312, and 313, respectively.

FIG. 13B is another example of a graph of phase distortion versus output power. The graph is similar to the simulation of FIG. 12B, except that the simulation is depicted for Band 12. The graph includes lines 341, 342, and 343 corresponding to line lines 321, 322, and 323, respectively.

Figure 14A:
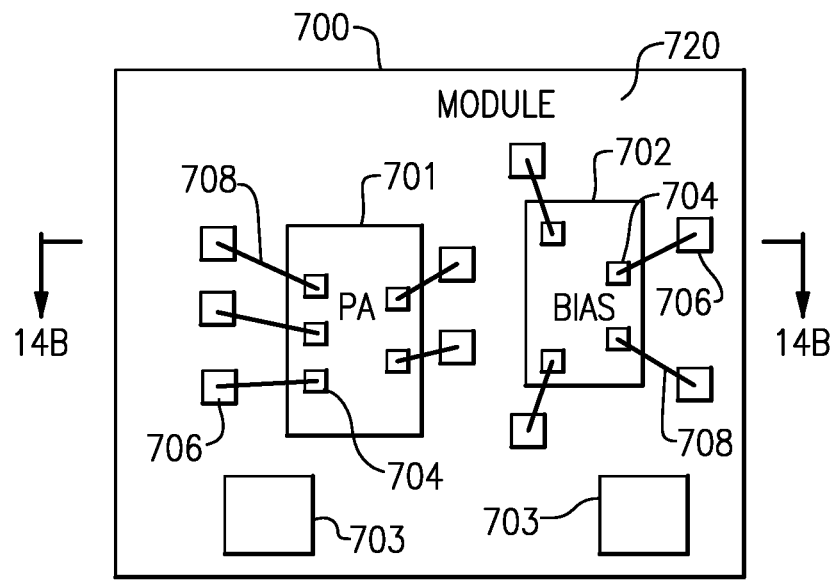
FIG. 14A is a schematic diagram of one embodiment of a packaged module.
Figure 14B:
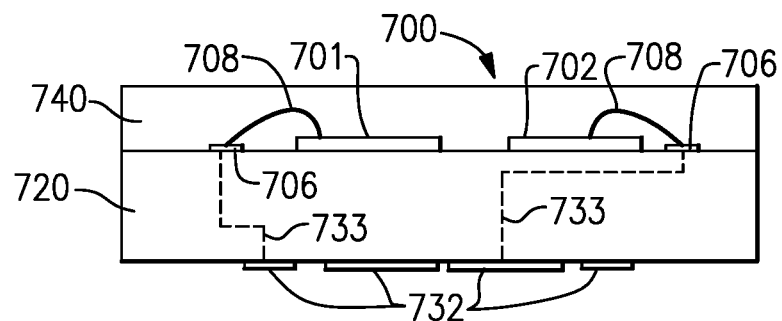
FIG. 14B is a schematic diagram of a cross-section of the packaged module of FIG. 14A taken along the lines 14B-14B.

FIG. 14A is a schematic diagram of one embodiment of a packaged module 700. FIG. 14B is a schematic diagram of a cross-section of the packaged module 700 of FIG. 14A taken along the lines 14B-14B.

The packaged module 700 includes a power amplifier die 701, a bias control die 702, surface mount components 703, wirebonds 708, a package substrate 720, and encapsulation structure 740. The package substrate 720 includes pads 706 formed from conductors disposed therein. Additionally, the dies 701, 702 include pads 704, and the wirebonds 708 have been used to connect the pads 704 of the dies 701, 702 to the pads 706 of the package substrate 720.

The power amplifier die 701 and the bias control die 702 are implemented in accordance with one or more features of the present disclosure. In certain implementations, the packaged module 700 includes a supply pin or pad for receiving a supply voltage from an external power management circuit. Additionally, the bias die 702 includes a bias control circuit that biases the power amplifier die 701 with one or more DC bias voltages. The bias die 702 can include a serial interface, such as a MIPI RFFE bus, used to control the one or more DC bias voltages.

In certain implementations, the power amplifier die 701 and the bias die 702 are manufactured using different processing technologies. In one example, the power amplifier die 701 is manufactured using a heterojunction bipolar transistor (HBT) process (for instance, a compound semiconductor process such as gallium arsenide), and the bias control die 702 is manufactured using a complementary metal oxide semiconductor (CMOS) process.

The packaging substrate 720 can be configured to receive a plurality of components such as the dies 701, 702 and the surface mount components 703, which can include, for example, surface mount capacitors and/or inductors.

As shown in FIG. 14B, the packaged module 700 is shown to include a plurality of contact pads 732 disposed on the side of the packaged module 700 opposite the side used to mount the dies 701, 702. Configuring the packaged module 700 in this manner can aid in connecting the packaged module 700 to a circuit board such as a phone board of a wireless device. The example contact pads 732 can be configured to provide RF signals, bias signals, power low voltage(s) and/or power high voltage(s) to the dies 701, 702 and/or the surface mount components 703. As shown in FIG. 14B, the electrical connections between the contact pads 732 and the die 701 can be facilitated by connections 733 through the package substrate 720. The connections 733 can represent electrical paths formed through the package substrate 720, such as connections associated with vias and conductors of a multilayer laminated package substrate.

In some embodiments, the packaged module 700 can also include one or more packaging structures to, for example, provide protection and/or facilitate handling of the packaged module 700. Such a packaging structure can include overmold or encapsulation structure 740 formed over the packaging substrate 720 and the components and die(s) disposed thereon.

It will be understood that although the packaged module 700 is described in the context of electrical connections based on wirebonds, one or more features of the present disclosure can also be implemented in other packaging configurations, including, for example, flip-chip configurations.

Figure 15:
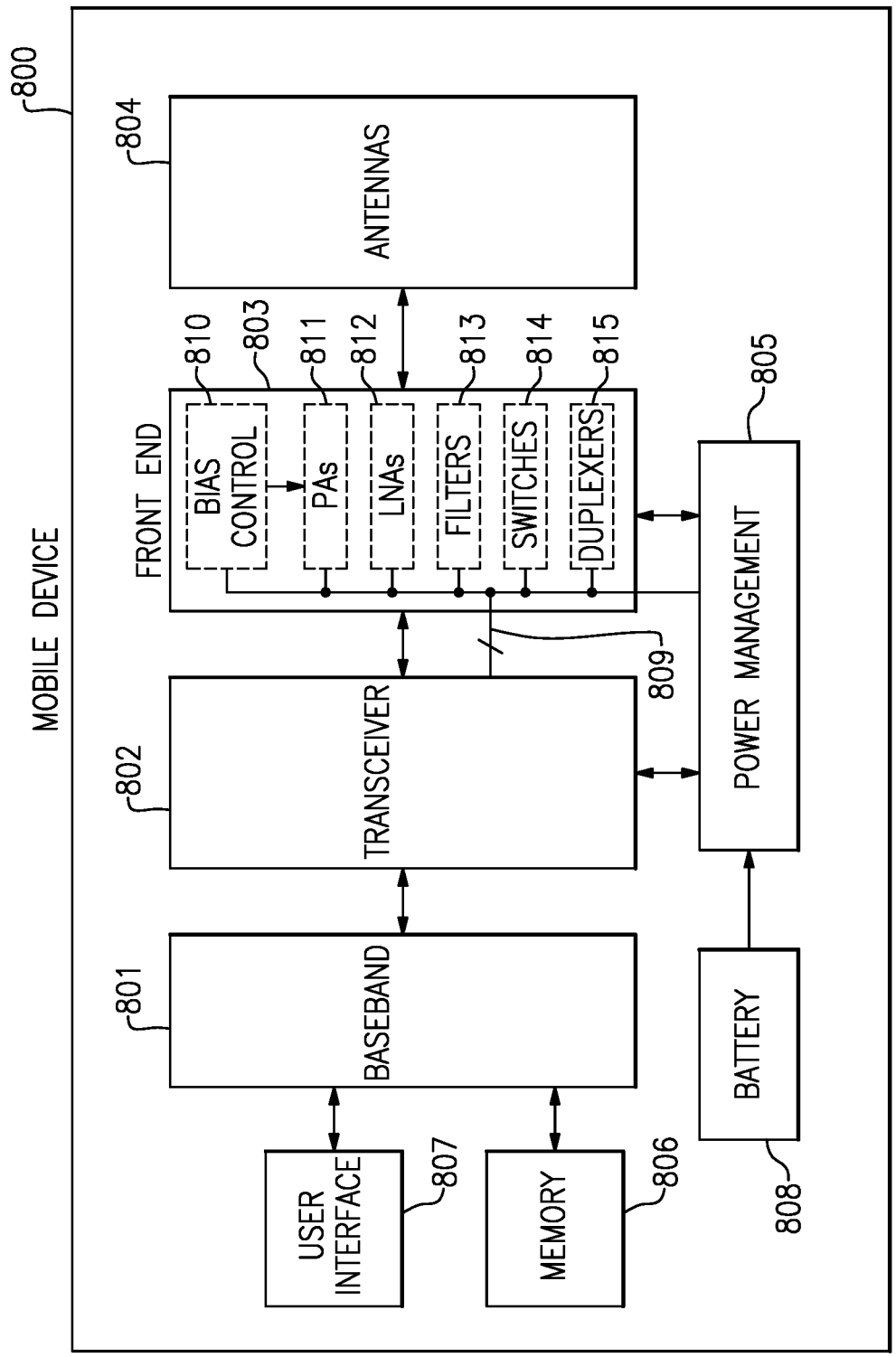
FIG. 15 is a schematic diagram of one embodiment of a mobile device.

FIG. 15 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

Although the mobile device 800 illustrates one example of an RF system that can include one or more features of the present disclosure, the teachings herein are applicable to electronic systems implemented in a wide variety of ways.

The mobile device 800 can be used communicate using a wide variety of communications technologies, including, but not limited to, 2G, 3G, 4G (including LTE, LTE-Advanced, and LTE-Advanced Pro), 5G, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 15 as the transceiver 802. In one example, separate components (for instance, separate circuits or dies) can be provided for handling certain types of RF signals.

As shown in in FIG. 15, the transceiver 802 is connected to the front end system 803 and to the power management circuit 805 using a serial interface 809. All or part of the illustrated RF components can be controlled by the serial interface 809 to configure the mobile device 800 during initialization and/or while fully operational. In another embodiment, the baseband processor 801 is additionally or alternative connected to the serial interface 809 and operates to configure one or more RF components, such as components of the front end system 803 and/or power management system 805.

The front end system 803 aids is conditioning signals transmitted to and/or received from the antennas 804. In the illustrated embodiment, the front end system 803 includes one or more bias control circuits 810 for controlling power amplifier biasing, one or more power amplifiers (PAs) 811, one or more low noise amplifiers (LNAs) 812, one or more filters 813, one or more switches 814, and one or more duplexers 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 15, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a power amplifier (PA) supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

The power management system 805 can operate in a selectable supply control mode, such as an average power tracking mode, an envelope tracking mode, a fixed supply mode, or other suitable power management mode. In the illustrated embodiment, the selected supply control mode of the power management system 805 is controlled by the transceiver 802. In certain implementations, the transceiver 802 controls the selected supply control mode using the serial interface 809.

As shown in FIG. 15, the power management system 805 receives a battery voltage from the battery 808. The battery 808 can be any suitable battery for use in the mobile device 800, including, for example, a lithium-ion battery. Although the power management system 805 is illustrated as separate from the front end system 803, in certain implementations all or part (for instance, a PA supply control circuit) of the power management system 805 is integrated into the front end system 803.

Applications

Some of the embodiments described above have provided examples in connection with wireless devices or mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A front end system including a power amplifier configured to receive a radio frequency input signal with a plurality of power amplifier transistors that are connected in parallel with one another, and a bias network that biases the plurality of power amplifier transistors with at least one resistor and at least one capacitor, both the at least one resistor and the at least one capacitor connected in parallel between a DC bias voltage and the radio frequency input signal, an output of the at least one resistor and an output of the at least one capacitor, the radio frequency input signal in communication with a base of at least one of the plurality of power amplifier transistors, and the bias network has a reactance that is operable to track an intrinsic input capacitance of the plurality of power amplifier transistors.

2. The front end system of claim 1 wherein the bias network includes a second resistor and a second capacitor electrically connected in parallel between an input of a second power amplifier transistor and the DC bias voltage.

3. The front end system of claim 1 wherein the bias network includes a series combination of a capacitor and an inductor electrically connected between the DC bias voltage and the input of at least one of the plurality of power amplifier transistors, and a resistor in parallel with the series combination of the capacitor and the inductor.

4. The front end system of claim 1 wherein the power amplifier includes an input stage and an output stage, the plurality of power amplifier transistors incorporated in the output stage of the power amplifier.

5. The front end system of claim 1 wherein the bias network maintains a substantially flat phase response and a substantially flat amplitude response over a range of power levels.

6. A front end system A front end system including a power amplifier configured to receive a radio frequency input signal with a plurality of power amplifier transistors that are connected in parallel with one another, and a bias network that biases the plurality of power amplifier transistors with at least one resistor and at least one capacitor, both the at least one resistor and the at least one capacitor connected in parallel between a DC bias voltage and the radio frequency input signal, an output of the at least one resistor and an output of the at least one capacitor, the radio frequency input signal in communication with a base of at least one of the plurality of power amplifier transistors, and the bias network includes a bias impedance electrically connected between the DC bias voltage and an input of at least one of the plurality of power amplifier transistors, and a shunt impedance electrically connected between the input of the at least one of the plurality of power amplifier transistors and a reference voltage.

7. The front end system of claim 6 wherein the bias impedance includes a first resistor, and the shunt impedance includes a second resistor and a capacitor in series.

8. The front end system of claim 7 wherein the shunt impedance further includes an inductor in series with the second resistor and the capacitor.

9. A power amplifier system comprising:
a bias control circuit configured to generate a DC bias voltage; and
a power amplifier configured to receive a radio frequency input signal with a plurality of power amplifier transistors that are connected in parallel with one another, and a bias network biases the plurality of power amplifier transistors with at least one resistor and at least one capacitor, both the at least one resistor and the at least one capacitor connected in parallel between the DC bias voltage and the radio frequency input signal, an output of the at least one resistor and an output of the at least one capacitor, the radio frequency input signal in communication with a base of at least one of the plurality of power amplifier transistors, and the bias network has a reactance that is operable to track an intrinsic input capacitance of the plurality of power amplifier transistors.

10. The power amplifier system of claim 9 wherein at least one of the plurality of power amplifier transistors is a bipolar transistor having a base corresponding to the input.

11. The power amplifier system of claim 9 wherein the bias network includes a second resistor and a second capacitor electrically connected in parallel between an input of a second power amplifier transistor and the DC bias voltage.

12. The power amplifier system of claim 9 wherein the bias network includes a series combination of a capacitor and an inductor electrically connected between the DC bias voltage and an input to at least one of the plurality of power amplifier transistors, and a resistor in parallel with the series combination of the capacitor and the inductor.

13. The power amplifier system of claim 9 wherein the bias network maintains a substantially flat phase response and a substantially flat amplitude response over a range of power levels.

14. A power amplifier system comprising:
a bias control circuit configured to generate a DC bias voltage; and
a power amplifier configured to receive a radio frequency input signal with a plurality of power amplifier transistors that are connected in parallel with one another, and a bias network biases the plurality of power amplifier transistors with at least one resistor and at least one capacitor, both the at least one resistor and the at least one capacitor connected in parallel between the DC bias voltage and the radio frequency input signal, an output of the at least one resistor and an output of the at least one capacitor, and the radio frequency input signal in communication with a base of at least one of the plurality of power amplifier transistors, and the bias network includes a bias impedance electrically connected between the DC bias voltage and an input of at least one of the power amplifier transistors, and a shunt impedance electrically connected between the input of the at least one of the plurality of power amplifier transistors and a reference voltage.

15. The power amplifier system of claim 14 wherein the bias impedance includes a first resistor, and the shunt impedance includes a second resistor and a capacitor in series.

16. The power amplifier system of claim 15 wherein the shunt impedance further includes an inductor in series with the second resistor and the capacitor.

17. A method of biasing a plurality of power amplifier transistors, the method comprising:
generating a DC bias voltage using a bias control circuit;
amplifying a radio frequency input signal using a plurality of power amplifier transistors connected in parallel with one another;
biasing a base of at least one of the plurality of power amplifier transistors with the DC bias voltage using a bias network that includes at least one resistor and at least one capacitor, both the at least one resistor and the at least one capacitor connected in parallel between the DC bias voltage and the radio frequency input signal, an output of the at least one resistor and an output of the at least one capacitor, and the radio frequency input signal in communication with the base of the at least one of the plurality of power amplifier transistors; and
tracking an intrinsic input capacitance of the plurality of power amplifier transistors with a reactance of the bias network.

18. The method of claim 17 wherein the bias network includes a shunt impedance electrically connected between a base of at least one of the plurality of power amplifier transistors and a reference voltage.

19. The method of claim 17 wherein the bias network includes a second resistor and a second capacitor electrically connected in parallel between a base of a second power amplifier transistor and the DC bias voltage.

20. The method of claim 17 wherein the bias network maintains a substantially flat phase response and a substantially flat amplitude response over a range of power levels.

* * * * *